United States Patent
Sato et al.

(10) Patent No.: US 7,688,649 B2
(45) Date of Patent: Mar. 30, 2010

(54) SEMICONDUCTOR MEMORY DEVICE WITH DEBOUNCED WRITE CONTROL SIGNAL

(75) Inventors: Noriyoshi Sato, Tokyo (JP); Nobutaka Nasu, Tokyo (JP); Tetsuya Tanabe, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/073,751

(22) Filed: Mar. 10, 2008

(65) Prior Publication Data

US 2008/0165597 A1 Jul. 10, 2008

Related U.S. Application Data

(62) Division of application No. 11/438,228, filed on May 23, 2006, now abandoned.

(30) Foreign Application Priority Data

Jun. 16, 2005 (JP) ............................ 2005-175966

(51) Int. Cl.
*G11C 7/00* (2006.01)
(52) U.S. Cl. ............. 365/189.16; 365/120; 365/189.04; 365/189.05; 365/194
(58) Field of Classification Search ................... 365/96, 365/120, 189.04, 189.05, 194, 196, 206, 365/233, 222; 711/106, 105, 167; 327/377, 327/172, 174
See application file for complete search history.

(56) References Cited

U.S. PATENT DOCUMENTS

| 3,048,785 | A | * | 8/1962 | Cartier | ....................... 327/285 |
| 4,959,816 | A | * | 9/1990 | Iwahashi et al. | ......... 365/233.5 |
| 5,611,053 | A | * | 3/1997 | Wu et al. | ..................... 710/100 |
| 7,061,821 | B2 | | 6/2006 | Coteus et al. | |
| 2004/0257132 | A1 | * | 12/2004 | Park | ........................... 327/172 |
| 2005/0093610 | A1 | * | 5/2005 | Park | ........................... 327/377 |

FOREIGN PATENT DOCUMENTS

JP 06-021792 1/1994

OTHER PUBLICATIONS

M.M. Mano, Digital Design, 2002, 1991, 1984 Prentice Hall, Third Edition, All pages, and particularly pp. 53-55.*
M. Morris Mano, Digital Design, 2002, 1991, 1984 by Prentice-Hall, Inc., Third Edition, ISBN:0-13-062121-8, pp. 53-55.

* cited by examiner

*Primary Examiner*—Hoai V Ho
*Assistant Examiner*—Fernando N Hidalgo
(74) *Attorney, Agent, or Firm*—Rabin & Berdo. P.C.

(57) ABSTRACT

A semiconductor memory device having a memory cell array, an input buffer, an output buffer, and an input-output control circuit that receives a write control signal and controls the input and output buffers. The output buffer generates a commencement signal indicating commencement of output. A mask generating circuit generates a mask signal with delayed active-to-inactive transitions from the commencement signal. A masking circuit passes the write control signal to the input-output control circuit while the mask signal is inactive, and holds the write control signal in the write-disabling state while the mask signal is active. The mask signal prevents unintended writing of data in the memory cell array when the write control signal is contaminated by noise from the output buffer.

5 Claims, 4 Drawing Sheets

US 7,688,649 B2

SEMICONDUCTOR MEMORY DEVICE WITH DEBOUNCED WRITE CONTROL SIGNAL

CROSS-REFERENCE TO RELATED APPLICATIONS

This is a division of U.S. application Ser. No. 11/438,228, filed May 23, 2006. The present divisional application claims the benefit of priority of Japanese application 2005-175966, filed Jun. 16, 2005. The disclosures of the parent US application and the Japanese priority application are incorporated herein by reference.

BACKGROUND OF THE INVENTION

1. Field of the Invention

The present invention relates to noise control in a semiconductor memory device.

2. Description of the Related Art

A typical semiconductor memory device such as the dynamic random access memory (DRAM) shown in FIG. 1 comprises a column address buffer 11 for storing a column address and a row address buffer 12 for storing a row address included in an address signal ADR. The row address buffer 12 is connected to a row decoder 13 that decodes the row address and supplies the decoded address to a word line driver 14, which drives corresponding word lines of a memory cell array 15 according to the decoded address data.

The column address buffer 11 is connected to a column decoder 16, which outputs decoded column address signals to a set of sense amplifiers 17. In a read operation, the sense amplifiers 17 amplify data read from the memory cell array 15 onto bit lines and output amplified data from the addressed column to an input-output (I/O) selector 18. In a write operation, the sense amplifiers 17 write data received from the input-output selector 18 into the memory cell array 15 at the addressed column. The input-output selector 18 is connected to an input buffer 19 and an output buffer 20 for external input and output of data DQ.

The DRAM comprises a timing generator circuit 21 for generating timing signals according to a row address strobe (RAS) signal and a column address strobe (CAS) signal, a refresh control circuit 22 for controlling refreshing of the memory cell array 15, an internal address counter 23, a first-stage circuit 30 for generating a write control signal (WE0) according to an initialize signal (INI) and a write enable signal (/WE), and an input-output control circuit 24 for generating an internal enable signal (RMB) according to the RAS and CAS signals, an output enable signal (OE), and the write control signal WE0 received from the first-stage circuit 30, and supplying the generated internal enable signal RMB to the input buffer 19 and output buffer 20.

During initialization, when the initialize signal INI is high, the first-stage circuit 30 drives the write control signal WE0 low, disabling write operations. During normal operations, when the initialize signal INI is low, the first-stage circuit 30 inverts the write enable signal /WE and passes the inverted signal as the write control signal WE0 to the input-output control circuit 24.

In a normal read operation, the RAS signal, CAS signal, and output enable signal OE are active (low), and the write enable signal /WE is inactive (high). The first-stage circuit 30 inverts the write enable signal /WE, driving the write control signal WE0 supplied to the input-output control circuit 24 low. As a result, the input-output control circuit 24 outputs an internal enable signal RMB enabling the output buffer 20. This allows data to be read from the memory region of the memory cell array 15 designated by the address signal ADR, and to be supplied to an external circuit through the sense amplifiers 17, the input-output selector 18, and the output buffer 20 as data DQ. When it begins supplying data DQ to the external circuit, the output buffer 20 outputs a commencement signal (not shown).

In a normal write operation, the RAS signal, CAS signal, and write enable signal /WE are active (low), and the output enable signal OE is inactive (high). The first-stage circuit 30 inverts the write enable signal /WE, driving the write control signal WE0 supplied to the input-output control circuit 24 high. As a result, the input-output control circuit 24 outputs an internal enable signal RMB enabling the input buffer 19. This allows data DQ received from the external circuit to be stored in a memory region of the memory cell array 15 designated by the address signal ADR.

During the read operation, the write enable signal /WE remains high, the inverted write control signal WE0 generated by the first-stage circuit 30 remains low, and the input-output control circuit 24 holds write operations disabled. As increasingly large-capacity semiconductor memory devices such as DRAMs have increasingly fine circuit lines, however, the large flow of current that occurs when the output buffer 20 outputs data DQ can cause considerable ground-bounce noise in the fine-line power wiring pattern. If the external write enable signal /WE is routed on a path substantially adjacent to the output buffer 20, the write enable signal /WE may be contaminated by noise, and the input-output control circuit 24 may misinterpret the logic level of the write control signal WE0. If the low level of the write control signal WE0 is misinterpreted as the high level, the input-output control circuit 24 will enable the input buffer 19, causing unintended writing of data in the memory cell array 15.

Japanese Patent Application Publication No. 06-21792 discloses a selector device with provisions to prevent unintended operations by preventing the generation of glitch noise at select signal transitions. The selector device includes a selector, controlled by a select signal, which selects either of two inputs (A or B), a noise mask generation circuit that delays input A, and a noise masking circuit that combines the output of the selector with the output of the noise mask generation circuit to generate an output signal free of glitch noise.

SUMMARY OF THE INVENTION

An object of the present invention is to prevent unintended writing of data in a semiconductor memory device.

A more specific object is to prevent unintended writing of data because of ground-bounce noise.

A still more specific object is to prevent unintended writing due to contamination of a write control signal by noise due to current flow in an output buffer.

The invented semiconductor memory device has an input buffer, an output buffer, a memory cell array that stores data received through the input buffer and supplies stored data to the output buffer for external output, and an input-output control circuit that controls the input buffer and the output buffer according to external signals including at least a write control signal. The output buffer generates a commencement signal indicating commencement of output.

The semiconductor memory device also has a mask generating circuit and a masking circuit. The mask generating circuit generates a mask signal from the commencement signal, the mask signal becoming active at least as soon as the commencement signal becomes active and not becoming inactive until after the commencement signal has become inactive. The masking circuit passes the write control signal to the input-output control circuit while the mask signal is inactive, and holds the write control signal received by the input-output control circuit in the write-disabling state while the mask signal is active.

The mask generating circuit may generate the mask signal by delaying the commencement signal and performing a logic operation on the commencement signal and the delayed commencement signal.

Alternatively, the input-output control circuit may generate an internal enable signal commanding the output buffer to commence output, and the mask generating circuit may generate the mask signal by delaying the internal enable signal, delaying the commencement signal, and performing a logic operation on the delayed internal enable signal and the delayed commencement signal.

In either case, the mask generating circuit may delay active-to-inactive transitions by greater amounts than it delays inactive-to-active transitions.

The mask generating circuit may include a fuse-programmable resistor circuit and a fuse-programmable capacitor circuit for programming the delays.

The mask generating circuit and masking circuit prevent unintended writing of data by ensuring that the input-output control circuit does not receive a write-enabling signal contaminated by noise during episodes of ground bounce due to output signal transitions.

DETAILED DESCRIPTION OF THE INVENTION

Figure 1:
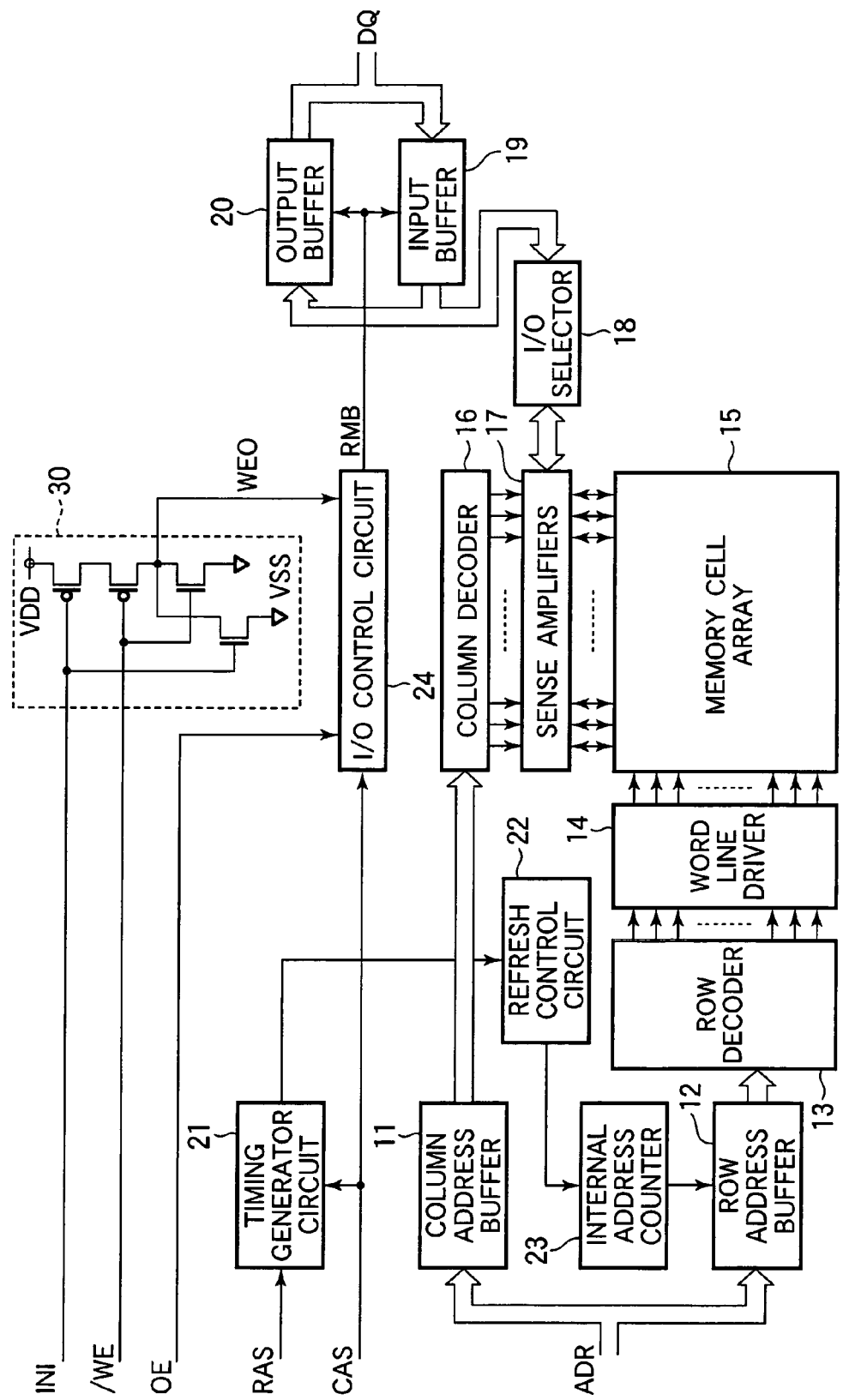
FIG. 1 is a schematic block diagram of a conventional DRAM.

Embodiments of the invention will now be described with reference to the attached drawings, in which like elements are indicated by like reference characters.

First Embodiment

Figure 2:
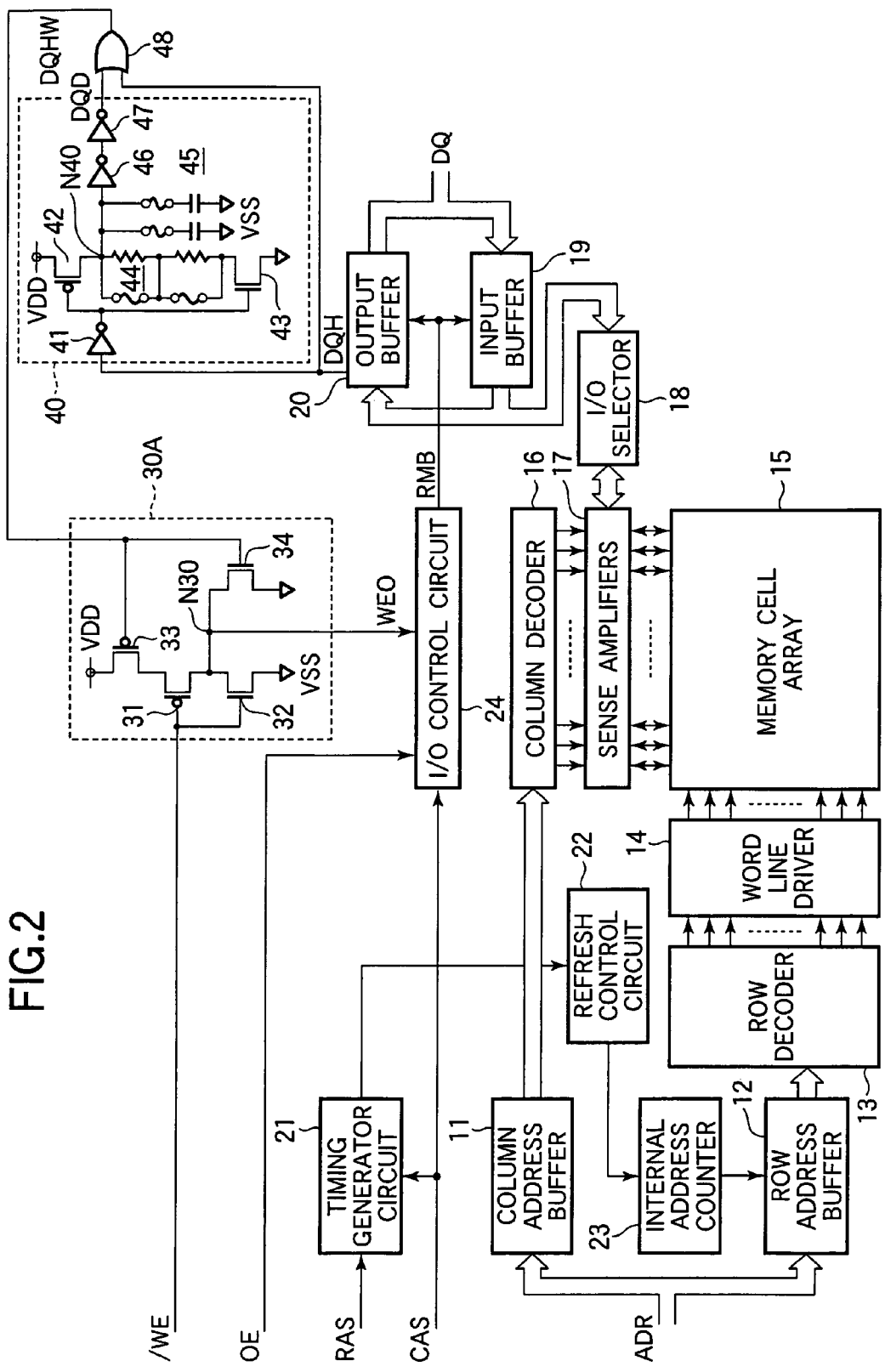
FIG. 2 is a schematic block diagram of a DRAM in a first embodiment of the invention.

Referring to FIG. 2, the first embodiment is a DRAM having a column address buffer 11 for storing a column address and a row address buffer 12 for storing a row address, both addresses being included in an address signal ADR. The row address buffer 12 is connected to a row decoder 13 that decodes the row address and outputs decoded row address signals to a word line driver 14. The word line driver 14 drives corresponding word lines in a memory cell array 15 according to the decoded signals output by the row decoder 13.

The column address buffer 11 is connected to a column decoder 16 that decodes the column address and outputs decoded column address signals to a set of sense amplifiers 17. In a read operation, the sense amplifiers 17 amplify data read from the memory cell array 15 onto bit lines and output amplified data from the column selected by the decoded column address signals to an input-output selector 18. In a write operation, the sense amplifiers 17 write data received from the input-output selector 18 into the memory cell array 15 at the column selected by the decoded column address signals. The input-output selector 18 is connected to an input buffer 19 and an output buffer 20 for external input and output of data DQ. The output buffer 20 also generates a commencement signal DQH to indicate the commencement of data output.

The DRAM comprises a timing generator circuit 21 for generating timing signals according to a RAS signal and a CAS signal, a refresh control circuit 22 for controlling refreshing of the memory cell array 15, an internal address counter 23, an input-output control circuit 24 for generating an internal enable signal (RMB) according to the RAS and CAS signals, an output enable signal (OE), and an internal write control signal WE0, and supplying the generated internal enable signal RMB to the input buffer 19 and the output buffer 20, a masking circuit 30A, a delay circuit 40, and an OR gate 48.

The /WE, OE, RAS, CAS, and ADR signals are generated externally by a circuit (not shown) that accesses the DRAM. The internal enable signal RMB has an active (high) state and an inactive (low) state; an inactive-to-active transition commands the output buffer 20 to latch data received from the sense amplifiers 17 and commence output. The input-output control circuit 24 also controls the input buffer 19 and input selector 18 according to the WED, OE, and CAS signals.

The masking circuit 30A is a NOR gate that generates a write control signal WE0 according to a mask signal (DQHW) and an external write control signal, more specifically a write enable signal /WE. The masking circuit 30A includes a complementary metal-oxide-semiconductor (CMOS) inverter comprising a p-channel metal-oxide-semiconductor (PMOS) transistor 31 and an n-channel metal-oxide-semiconductor (NMOS) transistor 32, and a further PMOS transistor 33 and NMOS transistor 34 switched on and off by the mask signal DQHW, which they receive at their gates. PMOS transistor 31 and NMOS transistor 32 receive the write enable signal /WE at their gates, and have their drains connected to a node N30. PMOS transistor 33 is connected in series with PMOS transistor 31 between the power supply (VDD) and node N30; NMOS transistor 34 is connected in parallel with NMOS transistor 32 between node N30 and ground (VSS). When the mask signal DQHW is inactive (low), the write enable signal /WE is inverted and output from node N30 as an internal write control signal WE0. When the mask signal DQHW is active (high), the internal write control signal WE0 is held in the low state.

The delay circuit 40 generates a delayed commencement signal (DQD) that becomes active (high) at least as soon as the commencement signal (DQH) received from the output buffer 20 becomes active (high) and becomes inactive following the active-to-inactive (high-to-low) transition of the commencement signal DQH by a delay determined by a programmable time constant. The delay circuit 40 includes an inverter 41, which inverts the commencement signal DQH and has its output terminal connected to the gates of a PMOS transistor 42 and an NMOS transistor 43. PMOS transistor 42 has its source connected to the power supply (VDD) and its drain connected to a node N40.

NMOS transistor 43 has its drain connected to node N40 through a fuse-programmable resistor circuit 44, and its source connected to ground (VSS). A fuse-programmable capacitor circuit 45 is coupled between node N40 and ground (VSS). A cascaded pair of inverters 46, 47 are connected to node N40; inverter 47 supplies the delayed commencement signal DQD.

The two input terminals of the OR gate 48 receive the delayed commencement signal DQD from the delay circuit 40 and the commencement signal DQH from the output buffer 20. The OR gate 48 performs a logic operation on the delayed commencement signal DQD and the commencement signal DQH to generate the mask signal DQHW, and supplies the generated mask signal DQHW to the masking circuit 30A.

The DRAM in the first embodiment has fine-line signal paths and power wiring patterns, and is physically laid out so that the external write enable signal /WE is routed substantially adjacent to the output buffer 20. (FIG. 1 is schematic and does not show the actual physical layout). The write enable signal /WE may accordingly be contaminated by ground-bounce noise caused by current flow when the output buffer 20 outputs data.

Noise removal in the DRAM in FIG. 2 in a read operation will be described below with reference to FIG. 3.

Figure 3:
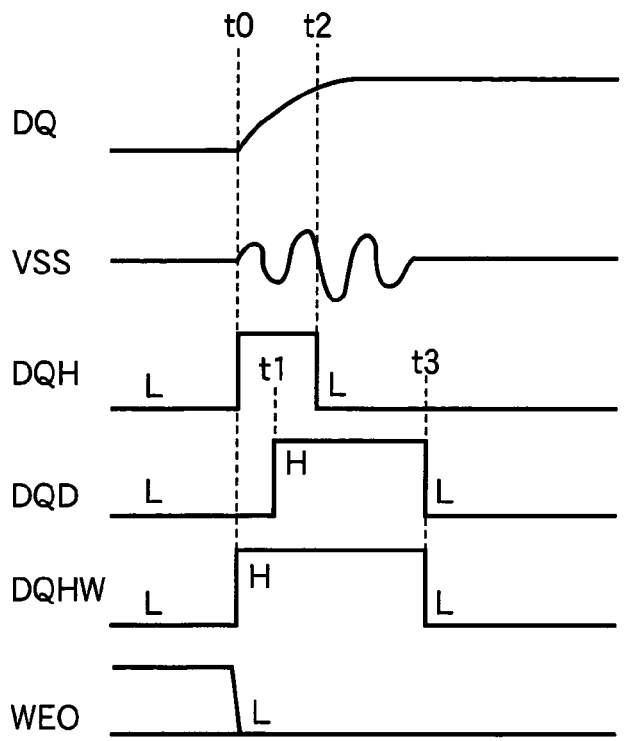
FIG. 3 is a waveform diagram illustrating the operation of the DRAM in FIG. 2.

In a normal read operation, at time t0 in FIG. 3, the RAS signal, CAS signal, and output enable signal OE remain or become active (low, denoted L), and the write enable signal /WE becomes or remains inactive (high, denoted H). (These signals are not shown in FIG. 3.) The mask signal DQHW is low during the interval just before time t0, so the masking circuit 30A inverts the write enable signal /WE, driving the write control signal WE0 supplied to the input-output control circuit 24 low at time t0 (WE0 may have been either high or low before time t0). As a result, the input-output control circuit 24 outputs an active internal enable signal RMB (not shown) commanding the output buffer 20 to commence output.

This allows data to be read from the memory region of the memory cell array 15 designated by the address signal ADR (not shown), and to be supplied to an external circuit through the sense amplifiers 17, input-output selector 18, and output buffer 20 as data DQ. Concurrently, the output buffer 20 outputs an active (high) commencement pulse DQH. When the output buffer 20 outputs data DQ, ground-bounce noise occurs until after the data signal DQ stabilizes, as shown by the VSS signal waveform.

On receiving the commencement signal DQH, the delay circuit 40 delays the commencement signal DQH by a length of time determined by the inverters 41, 46, 47 and the charge time of the capacitor circuit 45, which depends on the state of the fuses in the capacitor circuit 45. The delayed commencement signal DQD output from the delay circuit 40 goes high at time t1.

Although the commencement signal DQH returns to the low level at time t2, the delayed commencement signal DQD remains high because of the time constant of the resistor circuit 44 and capacitor circuit 45, which in combination form an integrating circuit.

Although the delayed commencement signal DQD returns to the low level at time t3, the pulse width of this signal DQD exceeds the pulse width of the commencement signal DQH because of the time constant of the resistor circuit 44 and capacitor circuit 45 in the delay circuit 40. The OR gate 48 performs an OR-logic operation on the commencement signal DQH and the delayed commencement signal DQD to generate the mask signal DQHW. Accordingly, the mask signal DQHW goes high at time t0 and remains high until time t3.

Since the masking circuit 30A receives a high mask signal DQHW from time t0 to time t3, PMOS transistor 33 is switched off and NMOS transistor 34 is switched on. Accordingly, node N30 is connected to ground, and the write control signal WE0 supplied from node N30 to the input-output control circuit 24 remains low, disabling write operations, regardless of any fluctuations in the external write enable signal /WE from time t0 to time t3.

In a normal write operation, the RAS signal, CAS signal, and write enable signal /WE are active (low), and the output enable signal OE is inactive (high). The masking circuit 30A inverts the write enable signal /WE, driving the write control signal WE0 supplied to the input-output control circuit 24 high. As a result, the input-output control circuit 24 enables the input buffer 19 and directs the input-output selector 18 to pass data from the input buffer 19 to the sense amplifiers 17. This allows data DQ received from the external circuit to be routed through the input buffer 19, input-output selector 18, and sense amplifiers 17 and stored in a memory region of the memory cell array 15 designated by the address signal ADR.

As described above, the DRAM in the first embodiment includes a delay circuit 40 that delays the commencement signal DQH received from the output buffer 20 and generates a delayed commencement signal DQD with a pulse width wider than the pulse width of the commencement signal DQH, an OR gate 48 that performs a logic operation on the commencement signal DQH and the delayed commencement signal DQD to generate the mask signal DQHW, and a masking circuit 30A that holds the write control signal WE0 at the ground level VSS (low), disabling write operations, while the mask signal DQHW is active. Accordingly, even if the external write enable signal /WE is affected by ground-bounce noise during a read operation, since the write control signal WE0 supplied from the masking circuit 30A is securely held at the low logic level, unintended writing of data in the DRAM is prevented.

Since the delay circuit 40 includes fuses for programming the delay time, the optimum delay timing is programmable without design modifications.

The first embodiment can be modified in various ways, such as, for example, the following.

(1) The circuit configuration of the DRAM may differ from that shown in FIG. 2 in various ways.

(2) The circuit configurations of the masking circuit 30A and the delay circuit 40 may differ from those shown in FIG. 2 in various ways.

(3) The first embodiment is not limited to DRAM but can be used for other types of memory cell arrays that store and output data.

(4) The first embodiment need not have the waveform timings and pulse widths shown as examples in FIG. 3.

Second Embodiment

Figure 4:
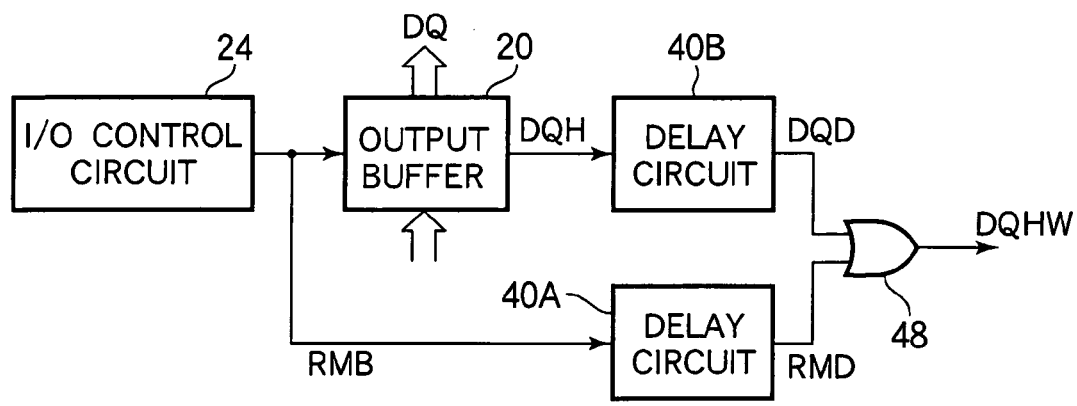
FIG. 4 is a block diagram of a mask signal generating circuit illustrating a second embodiment of the invention.

Referring to FIG. 4, the second embodiment is a mask signal generating circuit that replaces the combination of the delay circuit 40 and OR gate 48 that generated the mask signal DQHW in FIG. 2. The mask signal generating circuit in FIG. 4 includes delay circuits 40A, 40B and an OR gate 48. Both delay circuits 40A, 40B are identical to the delay circuit 40 in FIG. 2.

In a read operation, delay circuit 40A delays the internal enable signal RMB received from the input-output control circuit 24 to generate a delayed internal enable signal RMD with a pulse width wider than the pulse width of the internal enable signal RMB. Delay circuit 40B delays the commencement signal DQH that the output buffer 20 outputs on receiving the internal enable signal RMB, generating a delayed commencement signal DQD with a pulse width wider than the pulse width of the commencement signal DQH. The OR gate 48 performs an OR-logic operation on the delayed commencement signal DQD and delayed internal enable signal RMD to generate the mask signal DQHW, which it supplies to the masking circuit 30A in FIG. 2.

Figure 5:
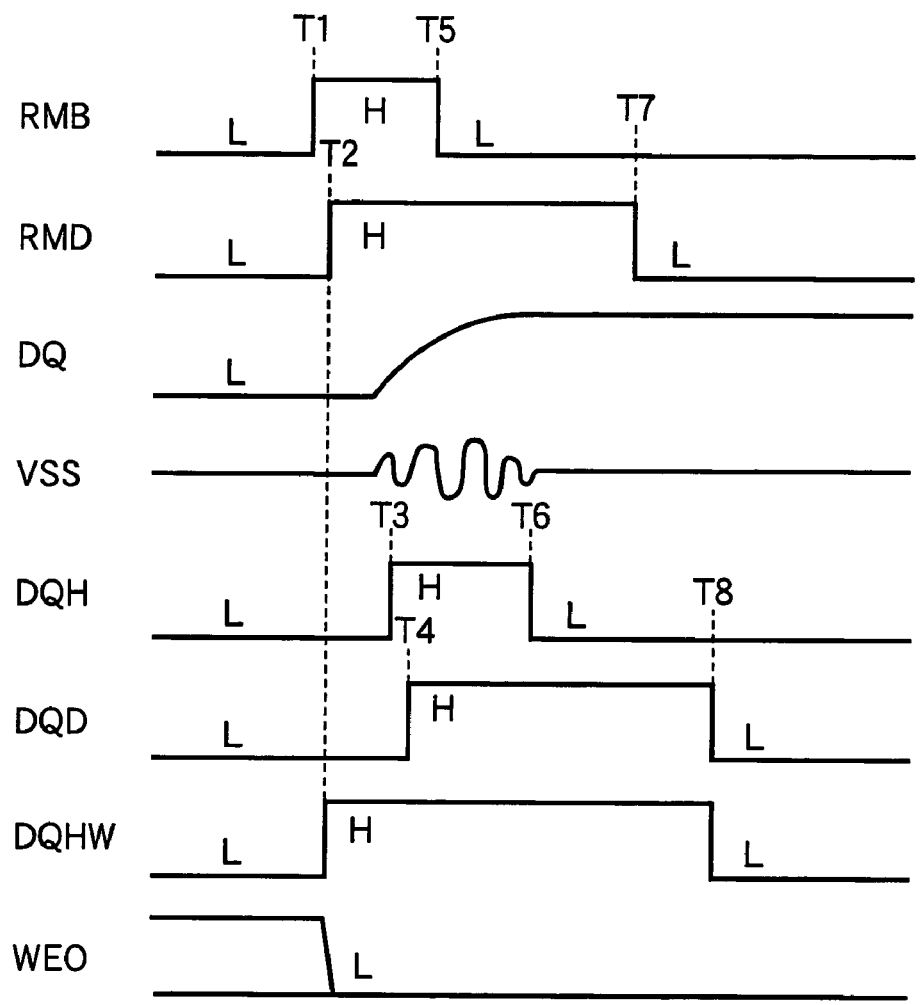
FIG. 5 is a waveform diagram illustrating the operation of the mask signal generating circuit in FIG. 4.

The operation of the mask signal generating circuit in FIG. 4 will be described below with reference to FIG. 5.

In a normal read operation, the internal enable signal RMB supplied from the input-output control circuit 24 goes active (high) at time T1. The delayed internal enable signal RMD supplied from delay circuit 40A goes active (high) slightly later, at time T2. After receiving the internal enable signal RMB, the output buffer 20 commences output of data DQ at time T3, driving the commencement signal DQH high. After receiving the commencement signal DQH, the delay circuit 40B drives the delayed commencement signal DQD high at time T4.

At time T5, the internal enable signal RMB returns to the low level, and after a time lag, the delayed internal enable signal RMD returns to the low level at time T7; at time T6, the commencement signal DQH returns to the low level, and after a time lag, the delayed commencement signal DQD returns to the low level at time T8.

Since the OR gate 48 performs an OR-logic operation on the delayed internal enable signal RMD and the delayed commencement signal DQD, the mask signal DQHW supplied from the OR gate 48 remains high from time T2 to time T8. The write control signal WE0 supplied from the masking circuit 30A accordingly remains low from time T2 to time T8, and the input-output control circuit 24 disables write operations during this period, regardless of fluctuations in the write enable signal /WE due to ground-bounce noise.

As described above, the mask signal generating circuit in the second embodiment includes a delay circuit 40B that generates a delayed commencement signal DQD according to the commencement signal DQH received from the output buffer 20, and another delay circuit 40A that generates a delayed internal enable signal RMD according to the internal enable signal RMB received from the input-output control circuit 24 in advance of output of the commencement signal DQH. The mask signal generating circuit generates the mask signal DQHW by performing a logic operation on the delayed commencement signal DQD and the delayed internal enable signal RMD. Since the low-to-high transitions of the internal enable signal RMB and delayed internal enable signal RMD precede the actual commencement of data output from the output buffer, the mask signal DQHW can be activated in advance of output of the commencement signal DQH. Even if the commencement signal DQH is delayed because of manufacturing process variations, ground-bounce noise is reliably masked in the internal write control signal WE0 received by the input-output control circuit.

A few variations were mentioned in the description of the first embodiment, but those skilled in the art will recognize that further variations are possible within the scope of the invention, which is defined in the appended claims.

What is claimed is:

1. A semiconductor memory device having a memory cell array that stores data received through an input buffer in a memory region designated by an address signal in a write operation and outputs data from the memory region designated by the address signal through an output buffer in a read operation. and having an input-output control circuit that controls the input buffer and the output buffer according to externally generated signals including at least a write control signal, wherein:
   the output buffer generates a commencement signal having an active state and an inactive state, the active state indicating commencement of output:
   the input-output control circuit generates an internal enable signal having an active state and an inactive state, the active state commanding the output buffer to commence output;
   the semiconductor memory device comprises
      a mask generating circuit for generating a mask signal having an active state and an inactive state from the commencement signal, the mask signal becoming active at least as soon as the commencement signal becomes active and remaining active until after the commencement signal has become inactive; and
      a masking circuit for passing the write control signal to the input-output control circuit while the mask signal is inactive, and holding the write control signal input to the input-output control circuit in a write-disabling state while the mask signal is active; and
   the mask generating circuit comprises
      a first delay circuit for delaying the internal enable signal to generate a delayed enable signal;
      a second delay circuit for delaying the commencement signal to generate a delayed commencement signal; and
      a logic circuit for performing a logic operation on the delayed enable signal and the delayed commencement signal to generate the mask signal.

2. The semiconductor memory device of claim 1, wherein:
   the first delay circuit delays inactive-to-active transitions of the internal enable signal by a first amount and delays active-to-inactive transitions of the internal enable signal by a second amount greater than the first amount; and
   the second delay circuit delays inactive-to-active transitions of the commencement signal by a third amount and delays active-to-inactive transitions of the commencement signal by a fourth amount greater than the third amount.

3. The semiconductor memory device of claim 2, wherein the first delay circuit includes a fuse-programmable resistor circuit and a fuse-programmable capacitor circuit for programming the second amount.

4. The semiconductor memory device of claim 2, wherein the second delay circuit includes a fuse-programmable resistor circuit and a fuse-programmable capacitor circuit for programming the fourth amount.

5. The semiconductor memory device of claim 1, wherein the internal enable signal and the commencement signal are active high and the logic circuit is an OR gate.

* * * * *